(12) United States Patent
Frach et al.

(10) Patent No.: US 11,898,906 B2
(45) Date of Patent: Feb. 13, 2024

(54) TIME-DOMAIN FILTERING OF GAMMA EVENTS

(71) Applicant: AVAGO TECHNOLOGIES INTERNATIONAL SALES PTE. LIMITED, Singapore (SG)

(72) Inventors: Thomas Frach, Aachen (DE); Torsten Solf, Aachen (DE); Dennis Groben, Aachen (DE)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 17/626,442

(22) PCT Filed: Jul. 14, 2020

(86) PCT No.: PCT/EP2020/069808
§ 371 (c)(1),
(2) Date: Jan. 11, 2022

(87) PCT Pub. No.: WO2021/013616
PCT Pub. Date: Jan. 28, 2021

(65) Prior Publication Data
US 2022/0244099 A1    Aug. 4, 2022

Related U.S. Application Data

(60) Provisional application No. 62/876,285, filed on Jul. 19, 2019.

(51) Int. Cl.
*G01J 1/44*    (2006.01)
*H03K 5/24*    (2006.01)
*H03K 5/26*    (2006.01)

(52) U.S. Cl.
CPC .............. *G01J 1/44* (2013.01); *H03K 5/2463* (2013.01); *H03K 5/26* (2013.01); *G01J 2001/4406* (2013.01); *G01J 2001/4466* (2013.01)

(58) Field of Classification Search
CPC ................. G01J 1/44; G01J 2001/4406; G01J 2001/4466; G01J 1/46; H03K 5/2463; H03K 5/26
See application file for complete search history.

(56) References Cited

U.S. PATENT DOCUMENTS 9,268,033 B2    2/2016  Frach
2007/0279037 A1  12/2007  Jouve
(Continued)

FOREIGN PATENT DOCUMENTS

CN    103364819 A    10/2013
CN    103759840 B    4/2014
(Continued)

OTHER PUBLICATIONS

International Search Report and Written Opinion of PCT/EP2020/069808, dated Nov. 16, 2020.

*Primary Examiner* — Tony Ko
(74) *Attorney, Agent, or Firm* — Foley & Lardner LLP (57) ABSTRACT

The present application relates generally to silicon photomultiplier (SiPM) detector arrays. In one aspect, there is a system including an array of cells each including a single-photon avalanche diode (SPAD) reverse-biased above a breakdown voltage of the SPAD. The system may further include a trigger network configured to generate pulses on a trigger line in response to SPADs of the array undergoing breakdown. The system may still further include a pulse-width filter configured to block pulses on the trigger line whose pulse width is less than a threshold width.

18 Claims, 8 Drawing Sheets

(56) References Cited

U.S. PATENT DOCUMENTS

| | | |
|---|---|---|
| 2012/0068077 A1 | 3/2012 | Frach |
| 2014/0048711 A1* | 2/2014 | Henseler ................ G01T 1/164 |
| | | 250/362 |
| 2016/0011321 A1 | 1/2016 | Solf |
| 2016/0061968 A1 | 3/2016 | Hansen |
| 2016/0091617 A1 | 3/2016 | Bouzid |

FOREIGN PATENT DOCUMENTS

| | | |
|---|---|---|
| CN | 104697646 A | 6/2015 |
| CN | 106940221 A | 7/2017 |
| WO | 2014135465 A1 | 9/2014 |

* cited by examiner

TIME-DOMAIN FILTERING OF GAMMA EVENTS

CROSS-REFERENCE TO PRIOR APPLICATIONS

This application is the U.S. National Phase application under 35 U.S.C. § 371 of International Application No. PCT/EP2020/069808, filed on Jul. 14, 2020, which claims the benefit of U.S. Provisional Patent Application No. 62/876,285, filed on Jul. 19, 2019. These applications are hereby incorporated by reference herein.

BACKGROUND

The following relates to silicon photomultiplier (SiPM) detector arrays of the type often used in digital Positron Emission Tomography (PET) systems, astronomy detectors, Light Detection and Ranging (LIDAR) systems, and the like. In a SiPM used for digital PET, each pixel of the detector array is itself composed of an array of cells, with each cell including a single photon avalanche diode (SPAD) that is reverse biased above its breakdown voltage, and a portion of the supporting circuitry. The supporting circuitry includes sub-modules for generating and validating a trigger event when a SPAD goes into breakdown, and counting the breakdown events across the array of cells of the pixel for a time interval after the trigger event. Following the trigger event (e.g. after breakdown), quench and refresh circuitry are used for accelerating reinstatement of a SPAD. Some illustrative examples of SiPM detector arrays for PET are described in Frach et al., U.S. Pat. No. 9,268,033 titled "Digital Silicon Photomultiplier for TOF-PET", and Solf, U.S. Pub. No. 2016/0011321 A1 titled "Timestamping Detected Radiation Quanta".

However, certain problems can arise due to noise. Specifically, a so-called dark count is a SPAD breakdown that is not related to a photon detection, but mostly due to thermally generated carriers in the single-photon avalanche diode junction. Such dark counts can lead to false triggers thereby introducing undesirable detector deadtime as the false trigger is processed, rejected, and the SiPM reset.

The following discloses certain improvements that addresses this problem and others.

SUMMARY

In one disclosed aspect, a system comprises: an array of cells each including a single-photon avalanche diode (SPAD) reverse-biased above a breakdown voltage of the SPAD; a trigger network configured to generate pulses on a trigger line in response to SPADs of the array undergoing breakdown; and a pulse-width filter configured to block pulses on the trigger line whose pulse width is less than a threshold width.

In another disclosed aspect, a method comprises: with a trigger network, generating pulses on a trigger line in response to single-photon avalanche diode (SPADs) of the array undergoing breakdown; and with a pulse-width filter, blocking pulses on the trigger line whose pulse width is less than a threshold width.

In another disclosed aspect, a trigger network for a silicon photomultiplier (SiPM) comprising an array of cells each including a single-photon avalanche diode (SPAD) reverse-biased above a breakdown voltage of the SPAD, the trigger network comprising: a network of OR gates connecting the cells of the array with a trigger line, the network of OR gates generating pulse on the trigger line in response to SPADs of the array undergoing breakdown; and a pulse-width filter configured to block pulses on the trigger line whose pulse width is less than a threshold width.

One advantage resides in providing a trigger line noise filter that efficiently rejects dark counts.

Another advantage resides in providing a trigger line noise filter that efficiently rejects dark counts without invoking energy-based validation logic and thereby avoiding unnecessary detector deadtime.

Another advantage resides in providing a trigger line noise filter that efficiently rejects dark counts without triggering integration and timestamping circuitry and thereby avoiding unnecessary detector reset processing.

Another advantage resides in an improved PET system with improved imaging capabilities.

Another advantage resides in an improved Light Detection and Ranging (LIDAR) system.

A given embodiment may provide none, one, two, more, or all of the foregoing advantages, and/or may provide other advantages as will become apparent to one of ordinary skill in the art upon reading and understanding the present disclosure.

BRIEF DESCRIPTION OF THE DRAWINGS

The invention may take form in various components and arrangements of components, and in various steps and arrangements of steps. The drawings are only for purposes of illustrating the preferred embodiments and are not to be construed as limiting the invention.

FIGS. 2A and 2B diagrammatically illustrate an embodiment of a detector pixel (or, more generally, a silicon photomultiplier, i.e. SiPM).

DETAILED DESCRIPTION

The following relates to silicon photomultiplier (SiPM) detector arrays of the type often used in medical nuclear imaging systems such as digital Positron Emission Tomography (PET) systems. However, there are many applications of the disclosed approaches both inside and outside of the field of nuclear medical imaging.

Figure 1:
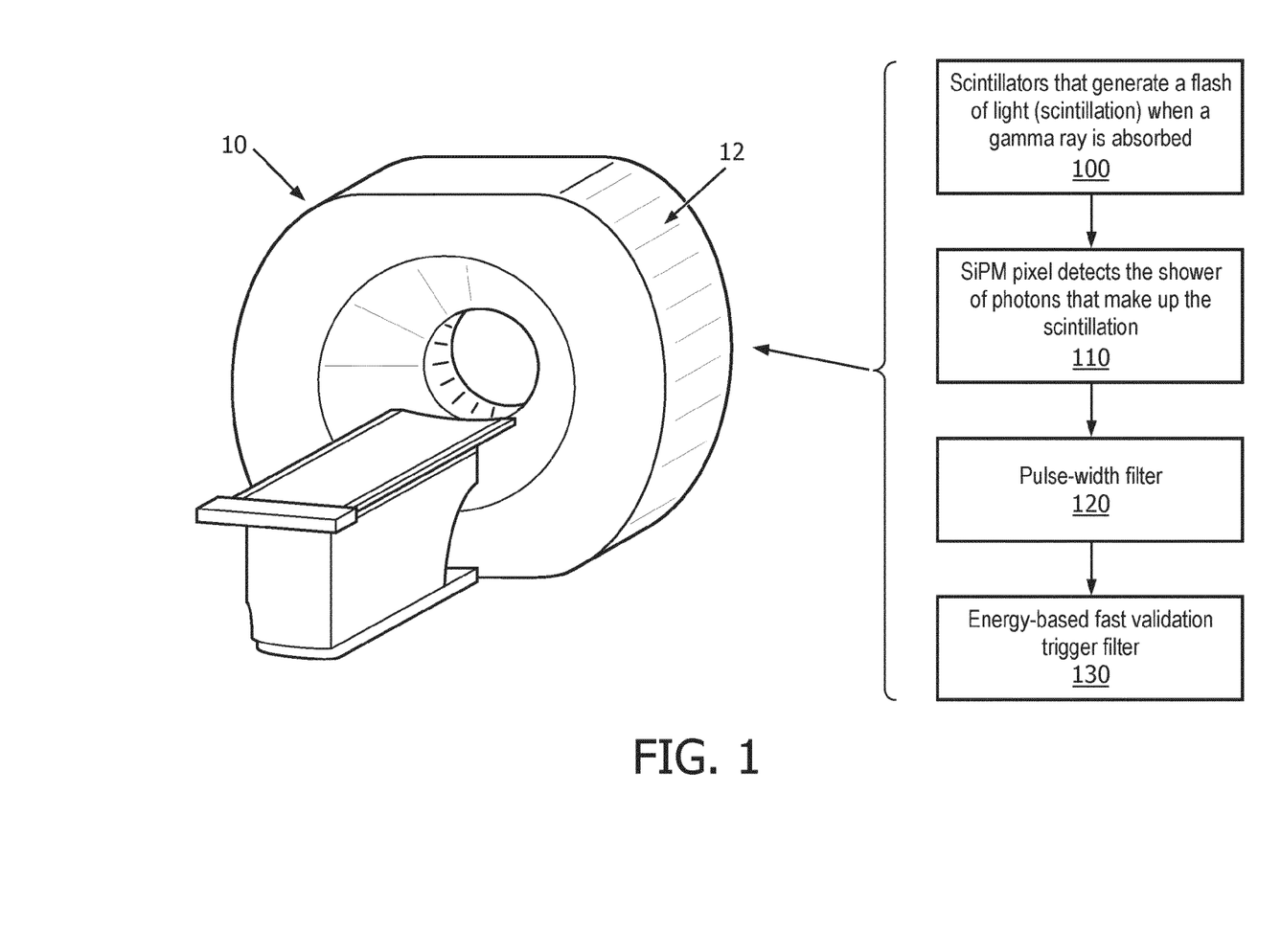
FIG. 1 diagrammatically illustrates an embodiment of a PET scanning system.

With reference to FIG. 1, a radioemission imaging system 10 includes scanner 12. The scanner 12 is arranged and sized to receive a prone human subject in an examination region.

Different scanning techniques and variations may be used in medical nuclear imaging. One such technique is PET. In one example of PET, a subject is administered a radiopharmaceutical that includes a positron-emitting radioisotope. The radiopharmaceutical may be designed to aggregate in an organ or tissue of interest, such as the brain, lungs, a tumor, or so forth. After administration of the radiopharmaceutical, the subject is loaded into the examination region. As time progresses, the radiopharmaceutical will emit positrons in radioactive decay events. A positron emitted by the radiopharmaceutical will travel for a short (generally negligible) distance before interacting with an electron. Once the positron interacts with the electron, both the positron and the electron will be annihilated and a pair of oppositely directed gamma photons (sometimes also called annihilation photons) are produced. The gamma photons move in opposite directions and each may be detected upon reaching a scintillator 100 in scanner 12. This example may depend on simultaneous detection of the pair of gamma photons. Therefore, some algorithms may discount gamma photons that do not arrive simultaneously.

To detect the gamma photons, silicon photomultiplier (SiPM) detector arrays are used. In these detectors, each pixel of the detector array is itself composed of an array of cells, with each cell including a single photon avalanche diode (SPAD) reverse biased above its breakdown voltage, and a portion of the supporting circuitry. (In the following, the term "pixel" is used to refer to the array of SPAD cells, since in PET applications this array of cells forms one pixel of the larger PET detector array. However, it will be appreciated that in some other applications, a single array of SPAD cells may be employed, e.g. as a radiation detector in a LIDAR system, in which case there may be only a single "pixel") The supporting circuitry includes sub-modules for generating and validating a trigger event when a SPAD goes into breakdown, counting the breakdown events across the array of cells of the pixel for a time interval after the trigger event, and assigning a digital timestamp to the event. Quench and refresh circuitry are used after breakdown for accelerating reinstatement of a SPAD. To provide high spatial resolution in a PET detector design, the silicon real estate occupied by each cell is made as small as practicable. While some supporting circuitry must be in the area of the cell in the array, where feasible parts of the supporting circuitry are placed at the periphery of the pixel, and are also designed to service multiple cells (e.g. an entire row of cells). Some illustrative examples of SiPM detector arrays for PET are described in Frach et al., U.S. Pat. No. 9,268,033 titled "Digital Silicon Photomultiplier for TOF-PET", and Solf, U.S. Pub. No. 2016/0011321 A1 titled "Timestamping Detected Radiation Quanta", both of which are incorporated herein by reference in their entireties.

The complete PET radiation detector for detecting gamma rays further includes scintillators 100 that generate a flash of light (scintillation) when a gamma ray is absorbed. The SiPM pixel 110 detects the burst of photons that make up the scintillation. The total number of counts over an integration time interval is a metric of the photon energy of the detection event, while the timing of the trigger signal provides the timestamp for the event. Furthermore, it is desirable to operate the SiPM at room temperature, or at least to limit the amount of cooling.

Of interest here, the trigger detection and validation circuitry is located at the periphery of the pixel area, and the trigger lines of the cells are combined by a trigger network comprising logical "OR" units. The effect of this is the final output is a train of trigger pulses generated by all SPADs of the pixel. Hence, a single trigger detection circuit can be employed for the entire pixel. The goal in some designs is to trigger on the very first SPAD breakdown so as to provide highest time resolution.

One problem which can arise is that SPADs can also be triggered due to noise. Specifically, a so-called dark count is a trigger event not related to a photon detection, but mostly due to thermally generated carriers in the single-photon avalanche diode junction. Generally, as the temperature increases, the noise (e.g., the dark count trigger events) also increases. In this regard, because the pixel triggers on the first SPAD breakdown, this can lead to false triggers. Energy-based validation circuitry can partially address this problem. Trigger validation circuitry validates the trigger signal and aborts the integration of counts if it is determined that the trigger signal was false (e.g., due to a thermally induced SPAD breakdown). In one approach, the trigger validation circuitry measures the electric current flowing through the bias network of the SiPM. If the total current stays below a certain current threshold for a selected time interval into the acquisition time period as measured by a discriminator or other circuitry, then the acquisition (that is, the count over the integration time interval) is aborted and an automatic reset sequence is initiated in preparation for the next trigger. If the electric current exceeds the threshold, then the discriminator output will rise to a 'high' level and the acquisition will continue. This approach works because the SPAD in its reversed biased quiescent state conducts very low electric current, whereas at breakdown it conducts a large electric current. Hence, if the trigger pulse was generated by a random thermal breakdown then the bias network current will be low (corresponding to the random breakdown rate), whereas if the trigger pulse was the first photon detection of a scintillation event then there should be a large number of SPAD breakdowns producing a larger bias network current. Another trigger validation approach, operating in the digital domain, is to detect the number of counts a short time interval into the integration time interval, and abort the integration if the counts are too low. These trigger validation approaches are referred to herein as energy-based validation, as the validation metrics are assessments of the energy of the scintillation (and hence, indirectly, of the gamma ray that generates the scintillation).

Time resolution is a further factor that is considered in system design. More specifically, when coupled to a time-of-flight capable scintillator, suitably fast trigger logic of a digital silicon photomultiplier enables time resolution typically in the range of 100 ps-200 ps. However, to obtain the best time resolution and assuming negligible scintillation pulse rise time, the integration time period of the digital silicon photomultiplier should be triggered to start at the very first photon detected by the device (that is, at the occurrence of the first SPAD breakdown). However, the digital silicon photomultiplier is not ideal and has certain level of noise (e.g., dark counts). Therefore, device configuration for best time resolution automatically leads to increased device dead time as it triggers on every dark count. Although validation can partially address the problem of dark current induced triggering, the solution is not wholly satisfactory. This is because there is a time interval between the triggering of the integration time interval and the subsequent aborting of the integration by action of the validation circuitry, followed by the automatic pixel controller reset sequence (including resetting the integration and time-stamping circuitry). This introduces sensor dead time over which the SPAD array cannot detect a scintillation event. For example, resetting the time-to-digital converter (TDC) that timestamps the trigger pulse can take up to 50 ns in some embodiments (see Solf, U.S. Pub. No. 2016/0011321 A1), which is problematic when designing for a 200 ps temporal resolution.

An approach for addressing this problem is described in a prior patent application Solf, U.S. Pub. No. 2016/0011321 A1. This approach inserts a 5 ns delay line at the output of the (combined) trigger line to provide time to verify the trigger using the energy-based validation logic before actually triggering the pixel controller. Here, the basic principle is to gate the first photon trigger pulses by a higher "energy" threshold. As an example, each photon (and dark count) generates a 1 ns long trigger pulse on the trigger network. At the output of the trigger network, the pulse train is sent on a 5 ns delay line followed by first input of an AND gate. The other input of the AND gate is connected to logic detecting higher energy levels (the validation logic, e.g. detecting higher energy levels by measuring the current in the biasing network or the early count of SPAD breakdowns), thereby deciding whether the particular pulse at the end of the delay line belongs to a real gamma event or to a dark noise event. This way, dark noise events are suppressed and do not trigger the pixel controller and therefore do not contribute to sensor dead time. Resulting dead time can be suppressed, which enables high coincidence time resolution even at room-temperature.

Furthermore, the event filter of Solf, U.S. Pub. No. 2016/0011321 A1 employs pulse encoding of trigger events. Therefore, it is sensitive to the trigger pulse width. Long pulse width creates dead time in the trigger network and can lead to event and dark noise triggers being merged together. It is therefore beneficial to keep the pulse width of the trigger pulse as short as possible, especially when operating the sensors at higher temperatures and hence high noise levels.

The present disclosure describes a different and/or additional approach to enhance the discrimination of the dark noise events by adding a pulse-width filter 120 prior to the actual energy-based fast validation trigger filter 130. The pulse width filter 120 is configured to block single trigger pulses (or more generally, pulses whose pulse width is less than some minimum threshold), typically originating from dark counts. This blocks the dark noise events and reduces the dead time of the pixel controller. In one example, a real event is represented by the detection of several dozen photons in the first nanosecond. Trigger pulses of those photons overlap in the trigger network, thereby prolonging the trigger pulse entering the pulse-width filter 120. The pulse-width filter 120 is a time-domain filter, and lets the longer pulse pass through and serve as a trigger pulse for triggering downstream components. Advantageously, the disclosed pulse width filter 120 rejects false triggers before they activate the downstream validation logic and time-stamping and integration circuitry, thereby avoiding the dead time associated false triggering of these processes and the subsequent pixel reset time.

Put another way, in one aspect, there is a programmable pulse-width filter/discriminator. Thus, in some embodiments, the threshold of the pulse-width filter (that is, the minimum pulse width that is passed) is a programmable filter parameter. The pulse width of each trigger can also be made variable/adjustable.

Figure 2A:
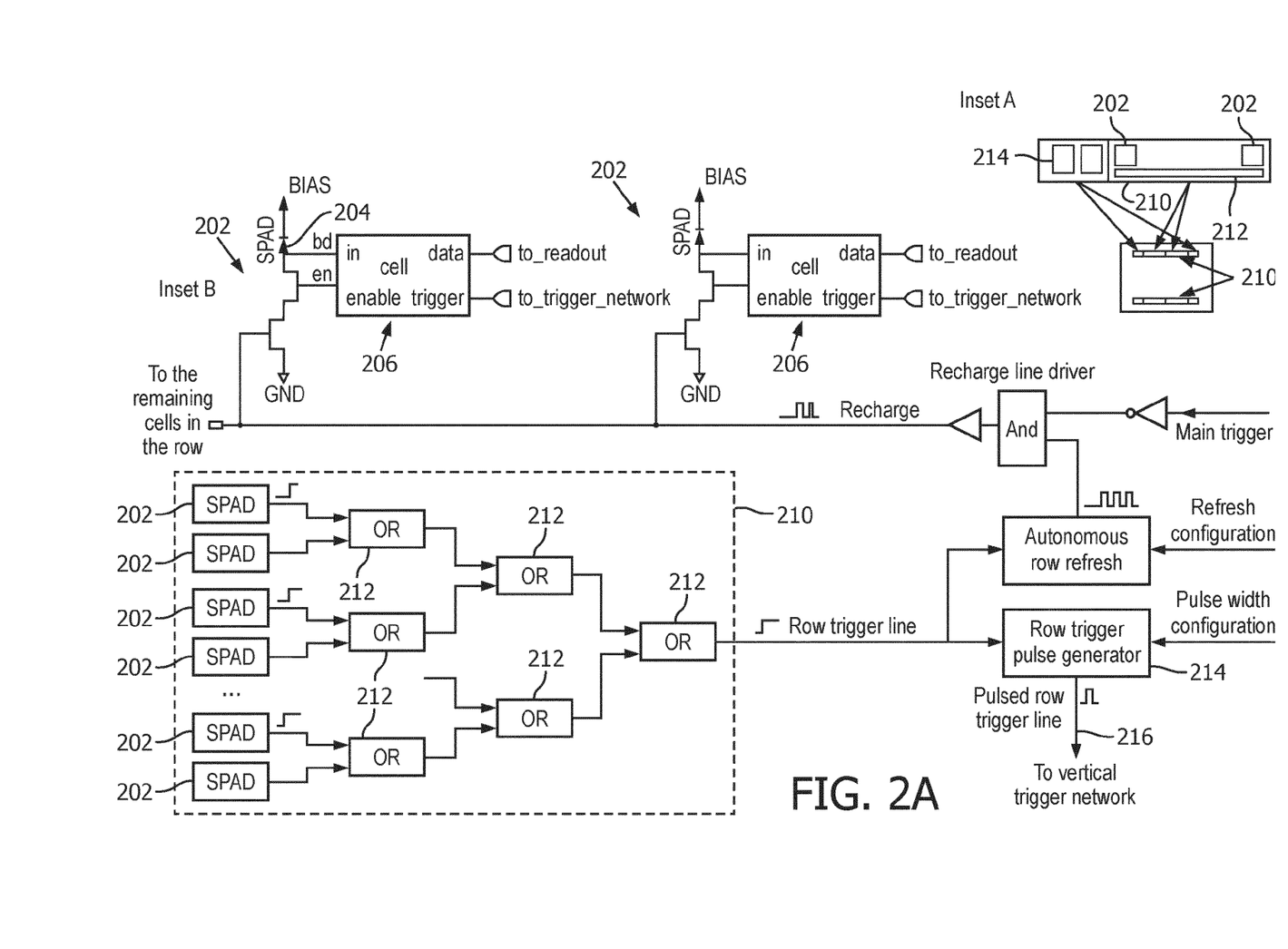
FIG. 2A illustrates circuitry of a single row.
Figure 2B:
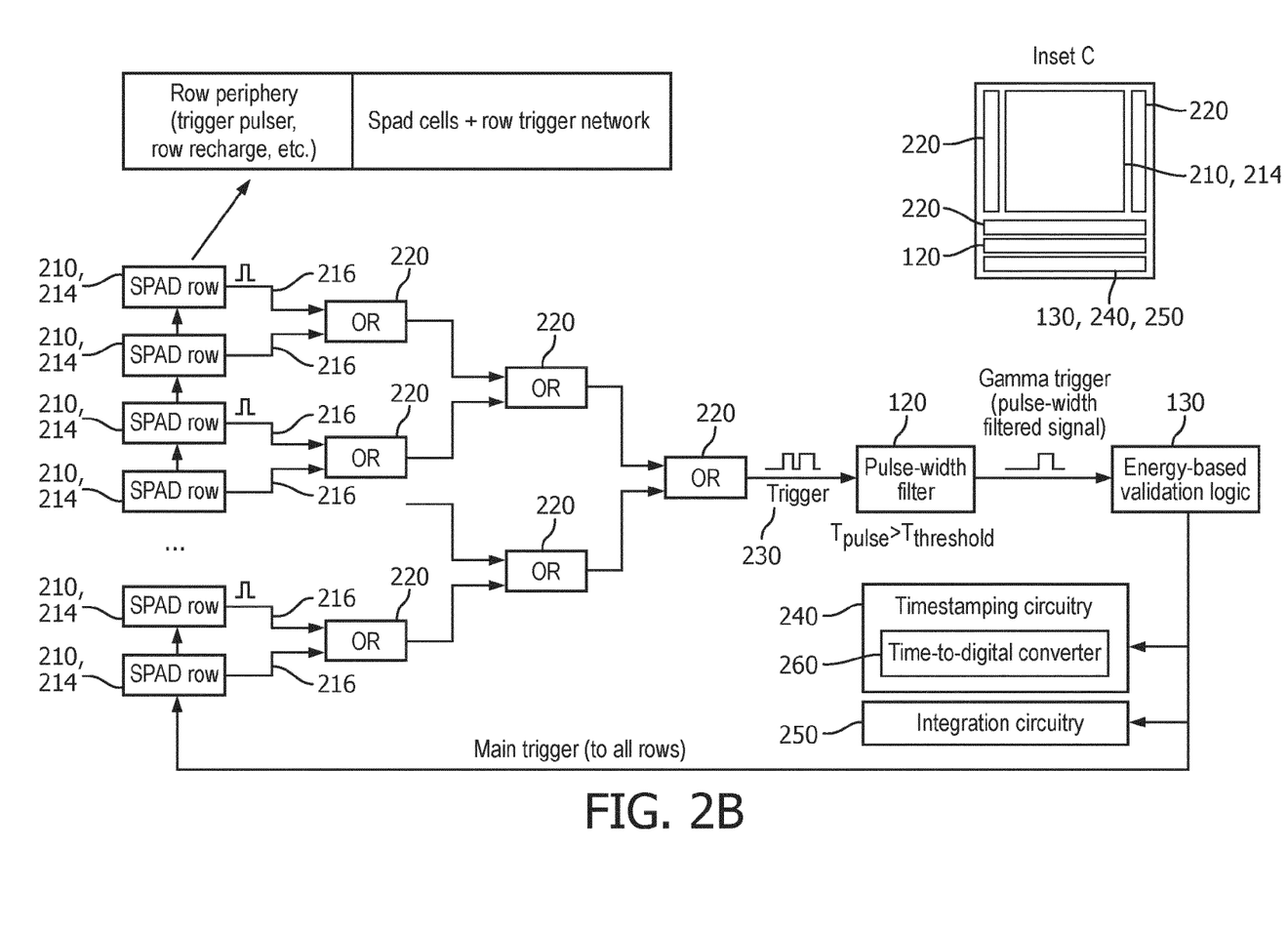
FIG. 2B illustrates circuitry combining the rows.

An illustrative embodiment of a detector pixel (or, more generally, a silicon photomultiplier, i.e. SiPM) is shown in FIGS. 2A and 2B. The PET detector typically consists of a ring of detector pixels. Each detector pixel comprises an array (200) of cells (202), as diagrammatically shown in Inset A of FIG. 2A. Inset A further diagrammatically illustrates the SiPM chip in plan view (lower part of Inset A), showing a suitable layout of the SPAD rows 210 and row trigger pulse generators 214; and a more detailed layout of one illustrative row (upper part of Inset A). As diagrammatically shown in Inset B of FIG. 2A, each cell 202 includes a single-photon avalanche diode (SPAD) 204 that is reverse-biased above a breakdown voltage of the SPAD 204. For design reasons, these SPAD cells are arranged in rows 210, and Inset B of FIG. 2A shows two cells 202 of a single row. Each row of SPAD cells 210 generates a trigger pulse of finite width (typically one nanosecond or less) when one or more SPADs in the row break down. FIG. 2A shows circuitry for generating the trigger pulse. The trigger lines of the SPADs 202 are connected by a tree of logical OR gates 212 to a row trigger pulse generator 214 that generates a pulse 216 in response to any SPAD 202 of the row entering breakdown (and hence generating a logical high on the tree of logical OR gates 212). Control logic 206 of the cell 202 also automatically quenches and recharges the broken-down SPADs, in order to restore the sensitivity. It is noted that the row 210, in the extreme case, could consist of a single SPAD cell.

Turning to FIG. 2B, inset C diagrammatically illustrates the SiPM chip in plan view, showing the SPAD array 210, 214 containing the SPAD rows 210 and associated row trigger pulse generators 214, and a suitable layout for the components 120, 220, 130, 240, 250 at the periphery of the SPAD array 210, 214. This is merely one illustrative example, and the detailed layout of components on the silicon chip area is suitably designed for specific applications. FIG. 2B further illustrates a trigger network consisting of (but not limited to) a tree of logical OR gates 220 combines trigger outputs 216 of the SPAD rows 210, 214 into a single trigger line 230. (It should be noted that the term "logical OR gate" as used herein is intended to encompass logical equivalents such as a De Morgan's equivalent, A OR B=NOT[NOT A AND NOT B]). Here, as shown in FIG. 2B, the pulses of individual rows 210, 214 are combined in time. Due to the asynchronous nature of the breakdowns, trigger pulses can partially overlap and merge into longer trigger pulses. The pulse-width filter 120 filters the trigger line 230 to block pulses on the trigger line 230 whose pulse width is less than a threshold width, and pass a trigger pulse whose pulse width exceeds the threshold width. Timestamp circuitry 240 is configured to assign a timestamp to the trigger pulse that passes through the pulse-width filter 120. The timestamp circuitry 240 may, for example, comprise at least one time-to-digital converter (TDC). In one approach, a leading edge of the trigger pulse passed by the pulse-width filter 120 serves to latch the value of a counter or other reference clock so as to provide the timestamp. More complex TDC circuits for providing time-stamping with high temporal resolution (e.g. useful for time-of-flight PET) are described in Frach et al., U.S. Pub. No. 2012/0068077 A1 titled "Method to Improve the Time Resolution of Digital Silicon Photomultipliers" which is incorporated herein by reference in its entirety. Furthermore, integration circuitry 250 is configured to accumulate a count of SPAD breakdown events in the array 200 of cells 202 over an integration time period triggered by the trigger pulse that passes through the pulse-width filter 120. The integration circuitry suitably comprises a digital counter that counts the number of SPAD breakdown events that occur over the integration time interval. Some suitable embodiments of integration circuitry are described in Frach et al., U.S. Pat. No. 9,268,033 and Solf, U.S. Pub. No. 2016/0011321 A1. In some embodiments, the trigger pulse passed by the pulse-width filter 120 also passes to the energy-based validation trigger filter 130 which is configured to validate the pulse on the trigger line that passes through the pulse-width filter. In response to a failure of the validation the optical detector resets (e.g., the timestamp circuitry 240 is reset, and the accumulation of breakdown counts by the integration circuitry 250 is aborted). The benefit of interposing the pulse-width filter 120 to remove shorter pulses on the trigger line 230 is as follows. As the typical dark count rate at the input of the trigger network is in the order of few 100 kcps, the average distance of trigger pulses at the output of the trigger network is typically >1 microsecond with pulse width in the order of one nanosecond. Hence, the probability of extension of the trigger pulse width by coincidence is very low (this is assuming low optical crosstalk in the sensor/scintillator).

Put another way, in FIG. 2B, a time domain pulse width filter 120 is inserted on the trigger line, after the last combining OR 220 but before entering the downstream timestamping, integration, and trigger validation logic. The premise is that, for a real gamma ray, the burst of photons will result in rapid triggering of many SPADs, so that when these are combined by the logical "OR" chain into a single combined trigger signal the result will be a long pulse. By contrast, a SPAD breakdown is an isolated event, and while the thermal breakdown rate may be fairly high, the random thermal breakdowns are unlikely to combine to generate a combined pulse of length comparable with that of a true gamma detection. Hence, by setting the time domain pulse width filter to pass only pulses of length longer than some minimum threshold length, the pulses due to thermal noise are rejected.

Figure 3:
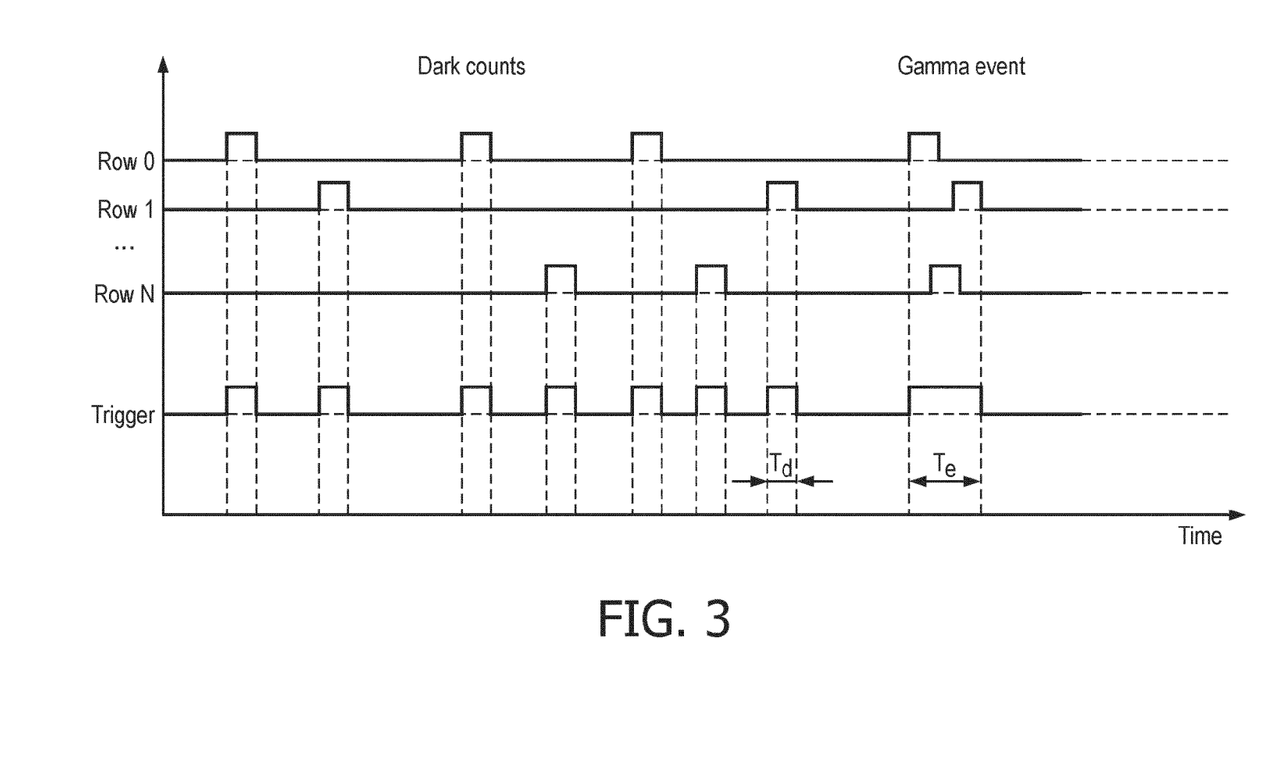
FIG. 3 illustrates an example of pulses caused by dark counts and a gamma event.

An example of overlapping trigger pulses is shown in FIG. 3. In case of a gamma event with sufficient energy, many rows trigger within a short time window and the probability of generating a sufficiently long trigger pulse increases. In FIG. 3, a detected time trigger time window for the gamma event is shown as $T_e$, whereas a detected trigger time window for a detected dark count event is shown as $T_d$. Higher energy deposition in the crystal lead to more photons emitted by the crystal and therefore higher probability of generating a trigger pulse able to pass the filter. In this way, the time-domain filter, in combination with the programmable pulse width, acts as an energy threshold. Variable trigger pulse width and filter parameters allow for optimization of the noise suppression for the given detector configuration. For example, the photon density in 1:1 coupled detectors is much higher compared to, for example, light sharing detectors. Therefore, in 1:1 coupled detectors, narrow row trigger pulses still overlap to trigger pulses of sufficient length and the trigger network dead time is minimized. In light sharing detectors with low photon density, the trigger pulse width has to be extended, and the pulse-width filter window has to be adapted, to still enable sufficient discrimination of the real events from noise. For very low photon densities (e.g. BGO or light-sharing detectors), time-domain filtering becomes less effective and means to bypass/disable the time-domain filter are implemented.

Another effect can occur in high photon density situation when the trigger pulse width is made too narrow. In this case, the pulse-width filter acts as a low-pass filter and the threshold of the following Schmitt trigger is not determined by the trigger of the first photon but by the integral value of the first N narrow pulses (duty cycle on the filter input). This can lead to a trigger signal passing the filter, causing the time stamp of this trigger not to be correlated to the first detected photon anymore and leading to deteriorated coincidence time resolution. Therefore, the some embodiments also comprise adjustable filter parameters including variable trigger pulse widths. Some embodiments also comprise providing for filter parameter tuning to adjust for the characteristics of different scintillator crystals and/or different noise levels (e.g. at different operating temperatures).

Figure 4:
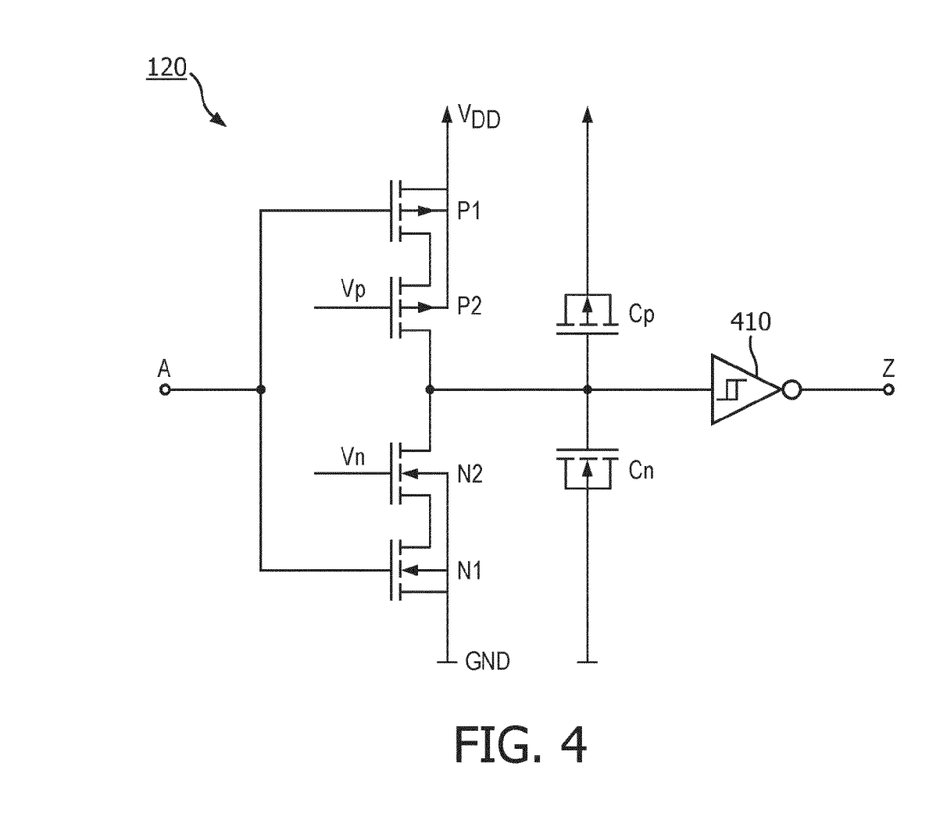
FIG. 4 illustrates an embodiment of a pulse-width filter.

One possible implementation of the pulse-width filter 120 is shown in FIG. 4. The illustrative pulse-width filter 120 comprises a starved inverter N1,N2/P1,P2 followed by a gate oxide capacitor pair Cn/Cp and an inverting Schmitt trigger 410. The Schmitt trigger 410 is intended to prevent oscillations when the voltage on Cn/Cp reaches levels close to the threshold voltage (e.g., approximately 100 mV). The starved inverter is used as a switched current source with adjustable current to charge/discharge the gate capacitors depending on the duty cycle of the input signal. The Schmitt trigger 410 provides the hysteresis and decides if the averaged input signal corresponds to a logic one or zero. Voltages Vn and Vp are used to adjust the currents for the rising and falling edges, and therefore the charge/discharge rates of Cn/Cp, respectively.

Figure 5:
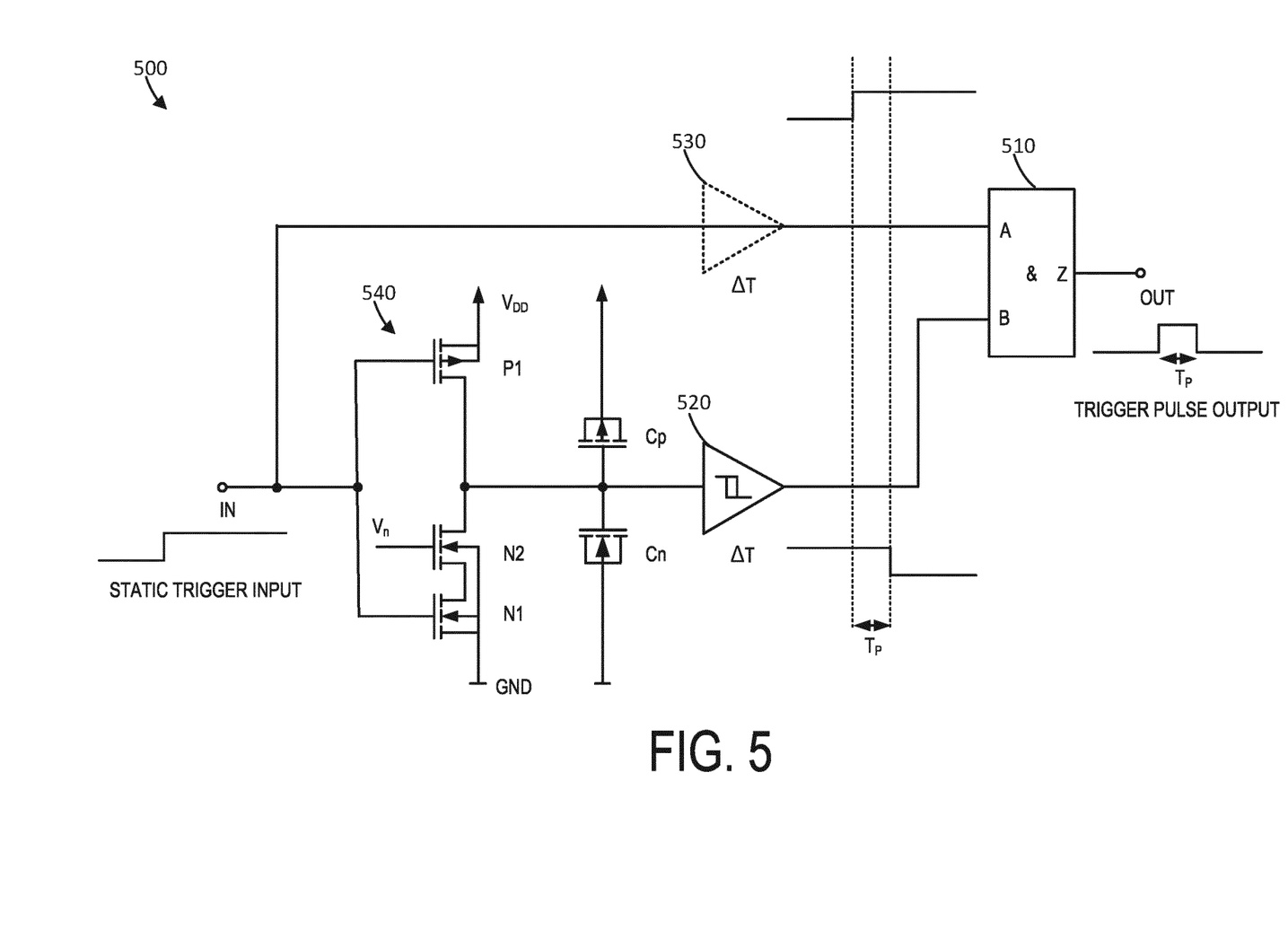
FIG. 5 illustrates an example of a variable width pulse generator implementation of the row trigger pulse generator of FIG. 2A.

FIG. 5 shows an example of a variable width pulse generator 500 which suitably serves as the row trigger pulse generator 214 of each row (see FIG. 2A) so as to provide variable pulse width. The implementation presented here also uses a starved inverter configuration 540 similar to that in the illustrative embodiment of the pulse-width filter 120 of FIG. 4; however, in the starved inverter configuration 540 of FIG. 5 is used as a variable delay element. To save chip area, only the rising edge of the input signal can be delayed by adjusting the bias voltage Vn of N2. The falling edge of the trigger input in does not have to be adjusted as it does not lead to a trigger pulse at the output out. The static, active-high trigger signal is connected to the AND gate 510 input A, and its inverted copy through the variable delay element 540 to the input B. Therefore, as the trigger input in switches from 0 to 1, input B is still at logic 1 and the AND gate 510 output Z switches to logic 1. After the adjusted delay Tp, AND gate 510 input B changes to logic 0 and so does the AND gate 510 output short time later. Therefore, the variable delay element 540 is utilized to adjust the pulse width Tp. Additional static delay element 530 (buffers) can optionally be added in front of input A of the AND gate 510, as indicated in FIG. 5, to compensate for internal delay ΔT of the Schmitt trigger 520, which would otherwise limit the minimum pulse width. In alternative implementations, the variable delay element 540 can be replaced by a number of fixed-delay elements (e.g. buffer or inverter chain, chain of fixed delay elements) connected to a multiplexer, which is then used to select the preferred delay. This has the advantage of avoiding analog voltages and digital-to-analog converters (chip area, noise sensitivity) but allows a selection of only a relatively small number of pulse widths.

Figure 6:
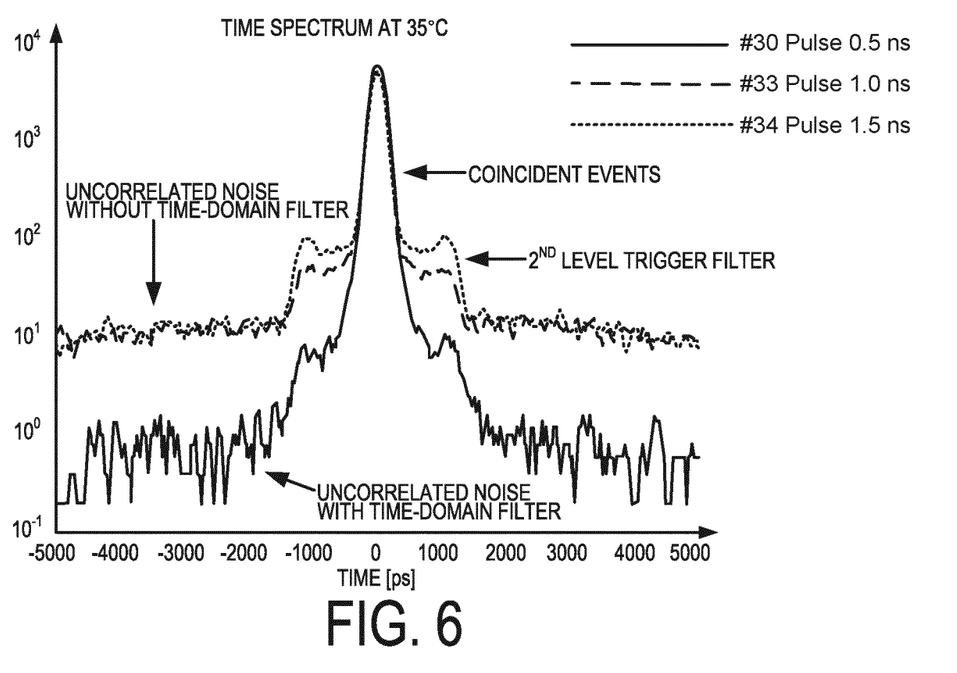
FIG. 6 illustrates the efficiency of the time-domain filter; more specifically, coincidence resolving time spectra of different pulse-width/trigger filter settings are illustrated.

FIG. 6 illustrates the efficiency of the time-domain filter. More specifically, FIG. 6 illustrates, coincidence resolving time spectra of different pulse-width/trigger filter settings. The noise floor is greatly reduced for triggers with short pulse width. The time-domain filter suppresses the dark count noise by an order of magnitude. This results in suppression of the noise floor of uncorrelated coincidence pairs (shown in FIG. 6 as the line corresponding to #30 pulse 0.5 ns) compared to trigger filter configurations using longer trigger pulses. The "shoulder" around the coincidence peak is due to a following fast-validation trigger filter as described in Solf, U.S. Pub. No. 2016/0011321 A1.

Figure 7:
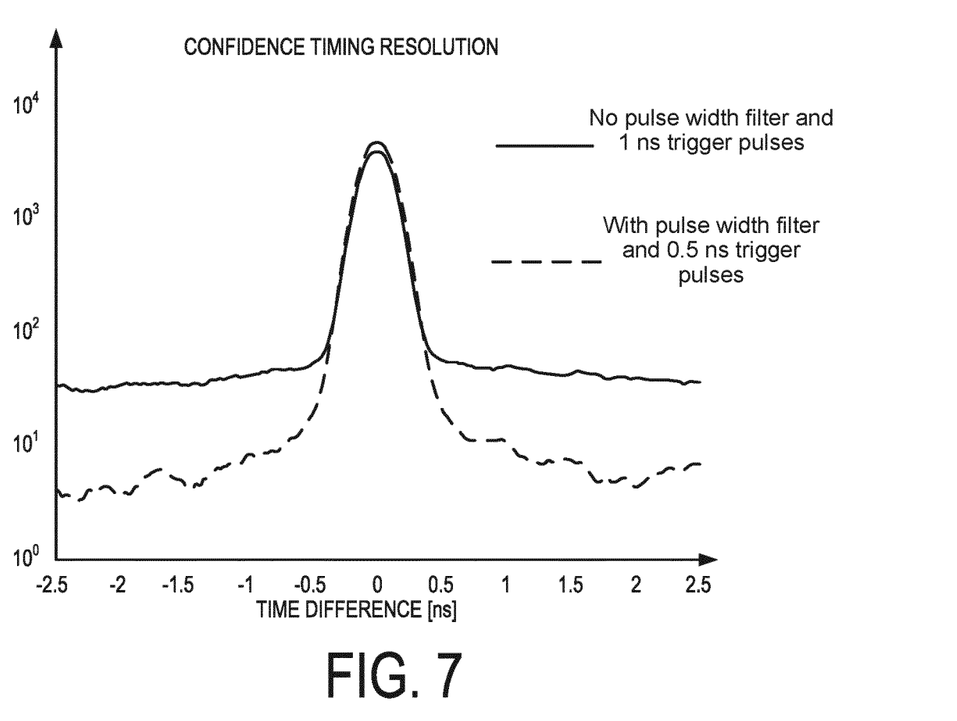
FIG. 7 shows the effect of the time-domain filter alone; more specifically measurements showing the effect of a pulse-width filter and variable pulse width with the second level fast validation filter disabled are illustrated.

FIG. 7 shows the effect of the time-domain filter alone. More specifically, FIG. 7 illustrates measurements showing the effect of a pulse-width filter and variable pulse width with the second level fast validation filter disabled. The pulse-width filter in combination with a short trigger pulse reduces the tails in the coincidence timing histogram efficiently. The probability that at least one of the timestamps is generated by a dark count hit is reduced strongly (factor of eight), whereas the shorter trigger pulse length would give only a reduction of a factor of two. Embodiments described here show a reduction in deadtime, leading to increased system sensitivity also at elevated temperatures (example here 35° C. with 98% sensitivity).

Figure 8:
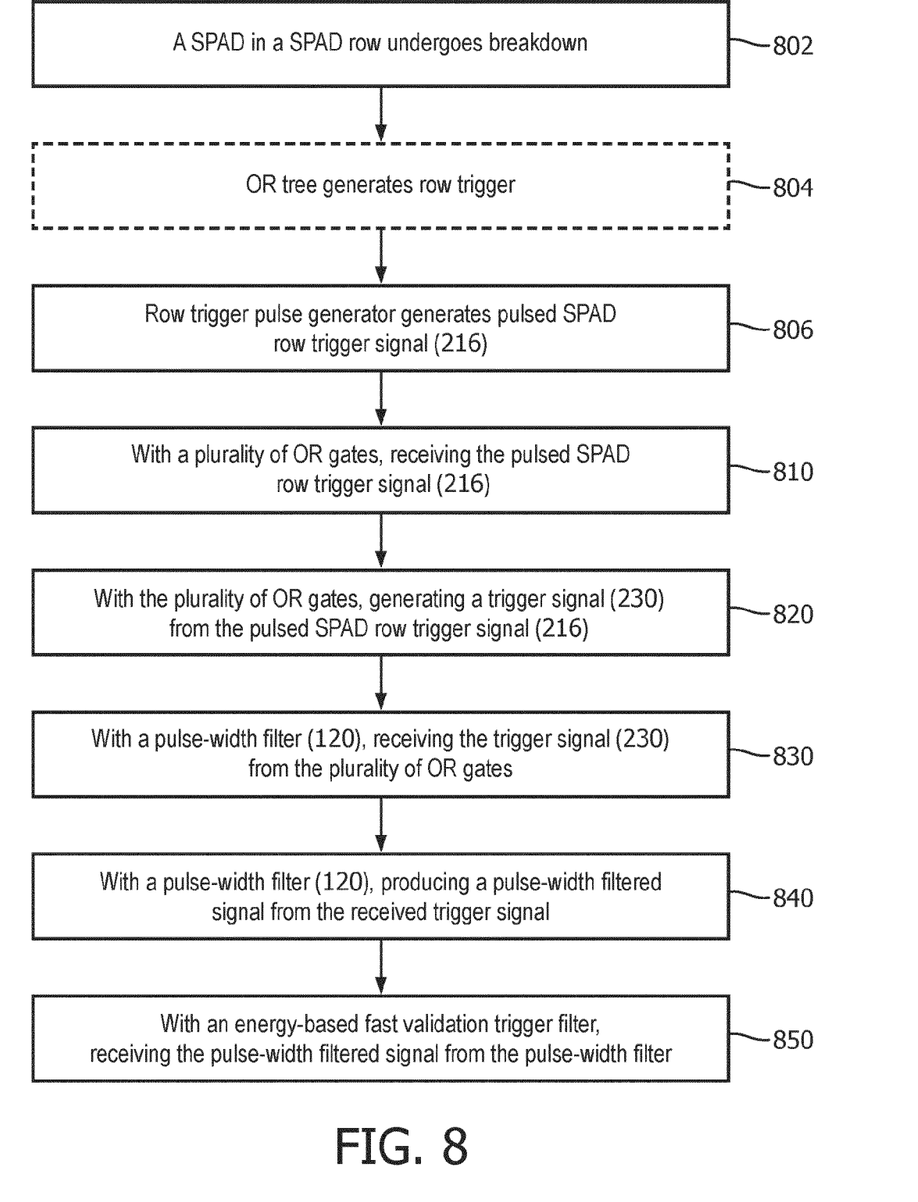
FIG. 8 diagrammatically illustrates an embodiment relating to a pulse-width filter.

FIG. 8 illustrates a flowchart of an embodiment relating to a pulse-width filter. With reference thereto, at step 802 a SPAD undergoes breakdown. At (optional) step 804, an OR tree generates a row trigger. At step 806, a row trigger pulse generator 214 generates a pulsed SPAD row trigger signal 216. At step 810, the SPAD row trigger signal 216 is received with a plurality of OR gates. At step 820, with the plurality of OR gates, a trigger signal 230 from the SPAD row trigger signal 216 is generated. At step 830, with a pulse-width filter 120, the trigger signal 230 is received from the plurality of OR gates. At step 840, with the pulse-width filter 120, a pulse-width filtered signal is produced from the received trigger signal. At step 850, with an energy-based fast validation trigger filter, the pulse-width filtered signal is received from the pulse-width filter.

In addition to PET, there are many other applications of the disclosed digital silicon photomultiplier, especially when used at high temperatures. More generally, other applications which require detection of optical pulses with high temporal resolution timestamping are contemplated. Other applications include, for example, PET/CT, PET/MR, SPECT, high energy physics, LIDAR, and fluorescence-lifetime imaging microscopy. Of particular interest is LIDAR systems which perform optical ranging based on time-of-flight between emission of a laser beam and detection of its reflection. LIDAR finds application in diverse industries including automotive, where it is used, for example, as a triggering device for activating emergency braking.

It will be further appreciated that the techniques disclosed herein may be embodied by a non-transitory storage medium storing instructions readable and executable by an electronic data processing device to perform the disclosed techniques. Such a non-transitory storage medium may comprise a hard drive or other magnetic storage medium, an optical disk or other optical storage medium, a cloud-based storage medium such as a RAID disk array, flash memory or other non-volatile electronic storage medium, or so forth.

The invention has been described with reference to the preferred embodiments. Modifications and alterations may occur to others upon reading and understanding the preceding detailed description. It is intended that the exemplary embodiment be construed as including all such modifications and alterations insofar as they come within the scope of the appended claims or the equivalents thereof.

The invention claimed is:

1. An optical detector, comprising:
   an array of cells each including a single-photon avalanche diode (SPAD) reverse-biased above a breakdown voltage of the SPAD;
   a trigger network configured to generate pulses on a trigger line in response to SPADs of the array undergoing breakdown, wherein the trigger network comprises a network of OR gates connecting the cells of the array with the trigger line; and
   a pulse-width filter configured to block pulses on the trigger line whose pulse width is less than a threshold width.

2. The optical detector of claim 1 further comprising timestamp circuitry configured to assign a timestamp to a trigger pulse that passes through the pulse-width filter.

3. The optical detector of claim 2 wherein the timestamp circuitry comprises a time-to-digital converter (TDC).

4. The optical detector of claim 1 further comprising integration circuitry configured to accumulate a count of SPAD breakdown events in the array of cells over an integration time period triggered by a trigger pulse that passes through the pulse-width filter.

5. The optical detector of claim 1 further comprising energy-based validation logic configured to validate the pulse on the trigger line that passes through the pulse-width filter, wherein in response to a failure of the validation, the optical detector resets.

6. The optical detector of claim 1, wherein the pulse-width filter comprises:
   a starved inverter comprising four transistors;
   a gate oxide capacitor pair; and
   an inverting Schmitt trigger configured to prevent voltage oscillations when a voltage on the capacitor pair reaches a predetermined voltage level.

7. The optical detector of claim 1, wherein the pulse-width filter comprises:
   a starved inverter;
   a capacitor pair; and
   an inverting Schmitt trigger.

8. The optical detector of claim 1, wherein the trigger network further includes a pulse generator comprising a variable width pulse generator including:
   a starved inverter configured to delay rising edges but not falling edges of the trigger signal;
   a Schmitt trigger configured to receive an output of the starved inverter; and
   an AND gate configured to output the pulse-width filtered signal by receiving:
      (i) a first input signal comprising the trigger signal; and
      (ii) a second input signal comprising an output signal of the Schmitt trigger.

9. The optical detector of claim 1, wherein the trigger network further includes a pulse generator comprising a variable width pulse generator including:
   a starved inverter configured to delay rising edges but not falling edges of the trigger signal;
   a Schmitt trigger configured to receive an output of the starved inverter;
   a static delay element configured to receive the trigger signal, and produce a statically delayed output signal by compensating for an internal delay of the Schmitt trigger; and
   an AND gate configured to output the pulse-width filtered signal by receiving:
      (i) a first input signal comprising the statically delayed output signal; and
      (ii) a second input signal comprising an output signal of the Schmitt trigger.

10. The optical detector of claim 1, wherein the trigger network further includes a pulse generator comprising a variable width pulse generator including:
    a starved inverter configured to delay rising edges but not falling edges of the trigger signal;
    a Schmitt trigger configured to receive an output of the starved inverter;

a plurality of static delay elements configured to receive the trigger signal;

a multiplexer configured to receive outputs of the plurality of static delay elements; and an AND gate configured to output the pulse-width filtered signal by receiving:
- (i) a first input signal comprising an output of the multiplexer; and
- (ii) a second input signal comprising an output signal of the Schmitt trigger.

11. A Light Detection and Ranging (LIDAR) system including an optical detector as set forth in claim 1.

12. A Positron Emission Tomography (PET) system comprising one or more PET detector rings comprising optical detectors as set forth in claim 1.

13. The optical detector of claim 1, wherein the pulse-width filter comprises:
- a starved inverter comprising four transistors;
- a gate oxide capacitor pair; and
- an inverting Schmitt trigger configured to prevent voltage oscillations when a voltage on the capacitor pair reaches a predetermined voltage level.

14. A method, comprising:
with a trigger network, generating pulses on a trigger line in response to single-photon avalanche diode (SPADS) of the array undergoing breakdown, wherein the trigger network comprises a network of OR gates connecting cells of an array with the trigger line; and with a pulse-width filter, blocking pulses on the trigger line whose pulse width is less than a threshold width.

15. The method of claim 14, further comprising:
with timestamp circuitry, assigning a timestamp to a trigger pulse that passes through the pulse-width filter.

16. The method of claim 14, further comprising:
with integration circuitry, accumulating a count of SPAD breakdown events in the array of cells over an integration time period triggered by a trigger pulse that passes through the pulse-width filter.

17. A trigger network for a silicon photomultiplier (SiPM) comprising an array of cells each including a single-photon avalanche diode (SPAD) reverse-biased above a breakdown voltage of the SPAD, the trigger network comprising:
- a network of OR gates connecting the cells of the array with a trigger line, the network of OR gates generating pulse on the trigger line in response to SPADs of the array undergoing breakdown; and
- a pulse-width filter configured to block pulses on the trigger line whose pulse width is less than a threshold width.

18. A Positron Emission Tomography (PET) system comprising one or more PET detector rings comprising a trigger network as set forth in claim 17.

* * * * *